(12) United States Patent
Hwang et al.

(10) Patent No.: US 9,658,273 B2
(45) Date of Patent: May 23, 2017

(54) METHOD OF DETECTING PARTIAL DISCHARGING LOCATION OF POWER DEVICE

(71) Applicant: HYOSUNG CORPORATION, Seoul (KR)

(72) Inventors: Kyung Rok Hwang, Busan (KR); Jae Ryong Jung, Gimhae-si (KR); Young Min Kim, Changwon-si (KR)

(73) Assignee: HYOSUNG CORPORATION, Seoul (KR)

( * ) Notice: Subject to any disclaimer, the term of this patent is extended or adjusted under 35 U.S.C. 154(b) by 224 days.

(21) Appl. No.: 14/434,299

(22) PCT Filed: Oct. 2, 2013

(86) PCT No.: PCT/KR2013/008804
§ 371 (c)(1),
(2) Date: Apr. 8, 2015

(87) PCT Pub. No.: WO2014/058173
PCT Pub. Date: Apr. 17, 2014

(65) Prior Publication Data
US 2015/0268292 A1    Sep. 24, 2015

(30) Foreign Application Priority Data
Oct. 9, 2012 (KR) ........................ 10-2012-0111696

(51) Int. Cl.
*G01R 29/00* (2006.01)
*G01R 31/02* (2006.01)
*G01R 31/12* (2006.01)

(52) U.S. Cl.
CPC ....... *G01R 31/1254* (2013.01); *G01R 31/027* (2013.01); *G01R 31/1227* (2013.01); *G01R 31/1236* (2013.01); *G01R 31/1272* (2013.01)

(58) Field of Classification Search
CPC .. G01R 31/027; G01R 27/2605; G01R 31/06; G01R 31/1272; G01R 31/1227;
(Continued)

(56) References Cited

U.S. PATENT DOCUMENTS 5,416,418 A * 5/1995 Maureira ............. G01R 31/083
                                                            324/532
5,475,312 A * 12/1995 Sedding ................. G01R 31/12
                                                            324/536
(Continued)

FOREIGN PATENT DOCUMENTS

| JP | 10-054862 A | 2/1998 |
|---|---|---|
| KR | 10-2011-0046226 A | 5/2011 |
| KR | 10-2011-0105963 A | 9/2011 |

*Primary Examiner* — Hoai-An D Nguyen
*Assistant Examiner* — Taqi Nasir
(74) *Attorney, Agent, or Firm* — Novick, Kim & Lee, PLLC; Jae Youn Kim

(57) ABSTRACT

Provided is a method of accurately detecting the location of a partial discharge in a power device. For this purpose, the present invention measures sequential positions of arrival of partial discharge signals and the differences in the time of arrival between the partial discharge signals with respect to a plurality of partial discharge sensors installed on the outside surface of a power device, divides the power device into a plurality of spatial sections, determines a spatial section where the location of a partial discharge is present using the sequential positions of arrival of the partial discharge signals, calculates the representative location value of the determined spatial section, and determines compensation values for the differences in the time of arrival to be applied with respect to the respective spatial sections.

8 Claims, 5 Drawing Sheets

(58) Field of Classification Search
CPC ... G01R 31/1254; G01R 31/025; G01R 31/346;
G01R 31/12; G01R 31/14; G01R 31/343;
G01R 35/02; G01R 31/08; G01R
31/1209; H02P 29/02; H02P 29/032;
H02P 29/027; H02P 29/00; H02P 29/021;
H02K 3/50; H02K 3/522; H02K 3/345;
H02K 3/493; H02K 3/527; H02K 15/12;
H02K 2213/03
USPC ....... 324/403, 413, 500, 509, 512, 528, 531,
324/76.76, 89, 122, 123 R, 380, 382,
324/765.01, 541, 544, 555, 557; 361/112,
361/212, 256, 257
See application file for complete search history.

(56) References Cited

U.S. PATENT DOCUMENTS

| | | | |
|---|---|---|---|
| 5,680,059 A * | 10/1997 | Shiota | G01R 31/1227 324/547 |
| 6,340,890 B1 * | 1/2002 | Bengtsson | G01R 31/1209 324/535 |
| 2007/0057677 A1 * | 3/2007 | Koch | G01R 31/1227 324/536 |
| 2010/0079148 A1 * | 4/2010 | Park | G01R 31/1254 324/536 |
| 2012/0286764 A1 * | 11/2012 | Lyu | G01R 31/1227 324/76.11 |

* cited by examiner

METHOD OF DETECTING PARTIAL DISCHARGING LOCATION OF POWER DEVICE

TECHNICAL FIELD

The present invention relates to the detection of the location of a partial discharge in a power device and, more particularly, to an apparatus and method for detecting the location of a partial discharge in a power device, which enable the location of a partial discharge, occurring in a power device, such as a transformer, to be accurately detected.

BACKGROUND ART

Since the sizes of discharge sources that generate partial discharges in power devices are mostly very small, it is difficult to accurately measure the location of a partial discharge and find and eliminate a discharge source. Accordingly, technology for measuring the location of a partial discharge is technology that is very important in the prevention of a failure in a power device.

Technology for measuring the location of a partial discharge may be divided into a method using attenuation attributable to the propagation of an electromagnetic wave discharge signal generated by a discharge, and a method using the differences between the times at which an electromagnetic wave discharge signal arrives at partial discharge sensors.

The former method using propagation attenuation is problematic in that it is difficult to maintain the intervals between the partial discharge sensors and signals detected by the partial discharge sensor are attenuated or deformed while being transferred to a measuring device, thereby reducing the reliability of the location information of a discharge. The latter method using the differences between the times at which an electromagnetic wave discharge signal arrives at partial discharge sensors is problematic in that a partial discharge signal is not transferred to the partial discharge sensors along rectilinear paths due to the internal structure of a power device, and thus an error occurs between the theoretical time of arrival and the actual time of arrival, thereby reducing the accuracy of estimation of a location.

In particular, a method of calculating the location of a partial discharge by applying the differences in the time of arrival of a partial discharge signal to a simultaneous equation numerical analysis algorithm was proposed. However, when the initial value of the simultaneous equation numerical analysis algorithm is erroneously set, the conventional method is problematic in that convergence speed is slow and diverging from the actual location of a partial discharge, rather than converging to the location, is performed.

DISCLOSURE

Technical Problem

Accordingly, the present invention is proposed to overcome the above problems occurring in the conventional art, and an object of the present invention is to provide a method of detecting the location of a partial discharge in a power device, which is capable of accurately detecting the location of a partial discharge occurring in a power device.

Another object of the present invention is to provide a method of detecting the location of a partial discharge in a power device, which applies a reliable initial value close to an actual solution when measuring the location of a partial discharge using a simultaneous equation numerical analysis algorithm, thereby enabling the location of the partial discharge to be rapidly detected.

Still another object of the present invention is to provide a method of detecting the location of a partial discharge in a power device, which compensates for an error in the arrival time of a partial discharge signal attributable to an internal structure of a power device, thereby enabling the accurate location of a partial discharge to be detected.

Technical Solution

In order to accomplish the above objects, the present invention provides a method of detecting the location of a partial discharge in a power device using partial discharge signals that arrive at a plurality of partial discharge sensors installed on the outside surface of a power device, the method including: dividing the power device into a plurality of spatial sections having the same volume; measuring the sequential positions of arrival of the partial discharge signals and the differences in the time of arrival between the partial discharge signals with respect to the partial discharge sensors; determining one of the spatial sections to be a spatial section where the location of the partial discharge is present using the measured sequential positions of arrival of the partial discharge signals, and calculating the representative location value of the determined spatial section; setting up quaternary simultaneous equations regarding the distances from the location of the partial discharge to the respective partial discharge sensors using the differences in the time of arrival between the partial discharge signals with respect to the respective partial discharge sensors, with the coordinates (x,y,z) of the location of the partial discharge and the partial discharge signal arrival time ($T_1$) for a first partial discharge sensor at which the partial discharge signal has arrived earliest being set as unknowns; and calculating the coordinates (x,y,z) of the location of the partial discharge from the quaternary simultaneous equations using a simultaneous equation numerical analysis algorithm, wherein the coordinates of the location of the partial discharge are calculated by applying the representative location value of the determined spatial section as the initial value of the simultaneous equation numerical analysis algorithm.

In the present invention, the plurality of partial discharge sensors may be installed at an origin set at a specific point on the outside surface of the power device and locations selected to correspond to three-dimensional rectangular coordinate axes X, Y and Z based on the origin.

In the present invention, the spatial sections of the power device may be 4 to 16 in number.

In the present invention, determining the spatial section may include determining one of the left and right spatial sections of the power device by comparing the sequential positions of arrival of the partial discharge signals with respect to the partial discharge sensors at the origin and along the X axis, determining one of the front and back spatial sections of the power device by comparing the sequential positions of arrival of the partial discharge signals with respect to the partial discharge sensors at the origin and along the Y axis, and determining one of the upper and lower spatial sections of the power device by comparing the sequential positions of arrival of the partial discharge signals with respect to the partial discharge sensors at the origin and along the Z axis; and determining the spatial section where the location of the partial discharge is present using the determined left or right, front or back, and upper or lower spatial sections.

In the present invention, measuring the differences in the time of arrival between the partial discharge signals with respect to the partial discharge sensors may include measuring the differences ($\Delta t_1$, $\Delta t_2$ and $\Delta t_3$) between the partial discharge signal arrival time ($T_1$) for the first partial discharge sensor at which the partial discharge signal has arrived earliest and the partial discharge signal arrival times ($T_2$, $T_2$ and $T_3$) for the other partial discharge sensors.

In the present invention, the partial discharge signal arrival time ($T_1$) for the first partial discharge sensor may be the time taken from a time point at which the partial discharge occurred to a time point at which the partial discharge signal has arrived at the first partial discharge sensor.

In the present invention, the method may further include, after setting up the quaternary simultaneous equations: extracting a compensation value for the differences in the time of arrival between the partial discharge signals corresponding to the determined spatial section from compensation values for the differences in the time of arrival between the partial discharge signals for the respective partial discharge sensors preset with respect to the respective spatial sections of the power device; and applying the extracted compensation value for the differences in the time of arrival between the partial discharge signals to the differences in the time of arrival between the partial discharge signals for the respective partial discharge sensors in the set-up quaternary simultaneous equations; wherein the coordinates of the location of the partial discharge are calculated from the quaternary simultaneous equations, to which the arrival time compensation value has been applied, using the simultaneous equation numerical analysis algorithm.

In the present invention, the preset compensation values for the differences in the time of arrival between the partial discharge signals for the respective partial discharge sensors may be set with respect to the sequential positions of the differences in the time of arrival between the partial discharge signals for the partial discharge sensors and with respect to the spatial sections.

Advantageous Effects

The method of detecting the location of a partial discharge in a power device according to the present invention, which is configured as described above, has the following advantageous effects:

In the present invention, when the location of a partial discharge is detected by applying a simultaneous equation numerical analysis algorithm regarding the differences in the time of arrival of a partial discharge signal in a power device, a spatial section where a partial discharge has occurred is primarily selected, and then the representative location value of the spatial section is used as the initial value of the simultaneous equation numerical analysis algorithm, thereby enabling the rapid, accurate detection of the location of the partial discharge.

Furthermore, in the present invention, an error in the time of arrival of a partial discharge signal attributable to the internal structure of power device is compensated for, thereby enabling the accurate location of a partial discharge to be detected in an actual power device.

MODE FOR INVENTION

Hereinafter, preferred embodiments of the present invention will be described with reference to the accompanying diagrams. Furthermore, in the description of the present invention, if it is determined that detailed descriptions of related well-known functions or configurations may make the gist of the present invention unnecessarily obscure, these detailed descriptions will be omitted.

Figure 1:
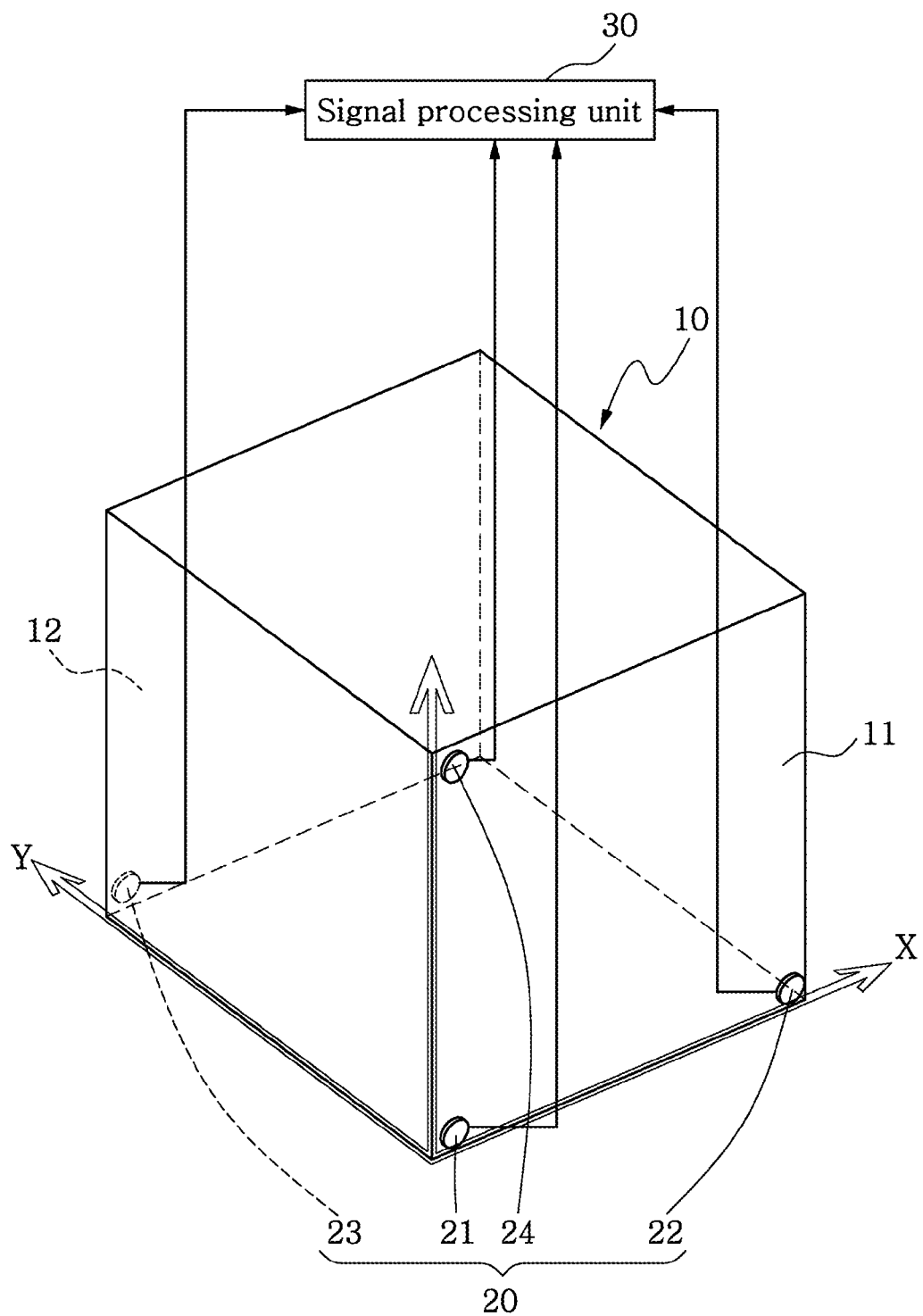
FIG. 1 is a configuration diagram of apparatus to which a method of detecting the location of a partial discharge according to the present invention is applied.

FIG. 1 is a configuration diagram of an apparatus for performing a method of detecting the location of a partial discharge in a power device according to the present invention. As illustrated in FIG. 1, the apparatus for detecting the location of a partial discharge in a power device 10 includes a plurality of partial discharge sensors 20 and a signal analysis device 30.

Preferably, the plurality of partial discharge sensors 20 are installed on the outside surface of the power device 10. The plurality of partial discharge sensors 20 detect partial discharge signals generated in the power device 10, and transmits them to the signal analysis device 30. The signal analysis device 30 accurately measures a location at which a partial discharge (PD) has occurred in the power device 10 using partial discharge signals input from the plurality of partial discharge sensors 20 via a preset specific analysis algorithm.

In an embodiment of the present invention, the partial discharge sensors 20 are four (21 to 24) in number. Although the number of sensors is merely an example and a number of sensors equal to or larger than the number of sensors may be installed, four partial discharge sensors are preferable in terms of the installation expenses of the partial discharge sensors 20 and the speed and complexity of signal processing. In particular, as in an example illustrated in FIG. 1, partial discharge sensors 20 may be installed along three-dimensional (3D) rectangular coordinate X, Y and Z axes in connection with the power device 10. That is, a specific point on the outside surface of the power device 10 is set as an origin O, and partial discharge sensors 20 are installed at locations including the origin and corresponding locations along the 3D rectangular coordinate X, Y and Z axes. It will be apparent that the present invention is not limited to these installation locations, but the installation locations may be changed.

In this case, although the power device 10 is illustrated as having a hexahedral shape in FIG. 1, the present embodiment is not limited to this shape. In power devices of various shapes, a plurality of partial discharge sensors 20 may be installed at an origin and corresponding locations along X, Y and Z axes substantially in a 3D space. In the present embodiment, for ease of description, the power device 10 of a hexahedral shape is described as an example.

The signal analysis device 30 detects the location of a partial discharge using various pieces of information related to partial discharge signals received from the plurality of partial discharge sensors 20. In particular, in the present embodiment, the signal analysis device 30 increases the accuracy of the detection of the location of a partial discharge using the sequential positions of arrival of partial discharge signals with respect to the respective partial discharge sensors 20 and the differences in the time of arrival between the partial discharge signals. In this case, the signal analysis device 30 of the present invention stores, in advance, basic information about the power device 10 whose partial discharge location will be measured. For example, the signal analysis device 30 stores the shape, size and signal propagation speed of the power device 10 and the location coordinates of the partial discharge sensors 20 in advance. A method of detecting the location of a partial discharge is described in detail below.

Figure 2:
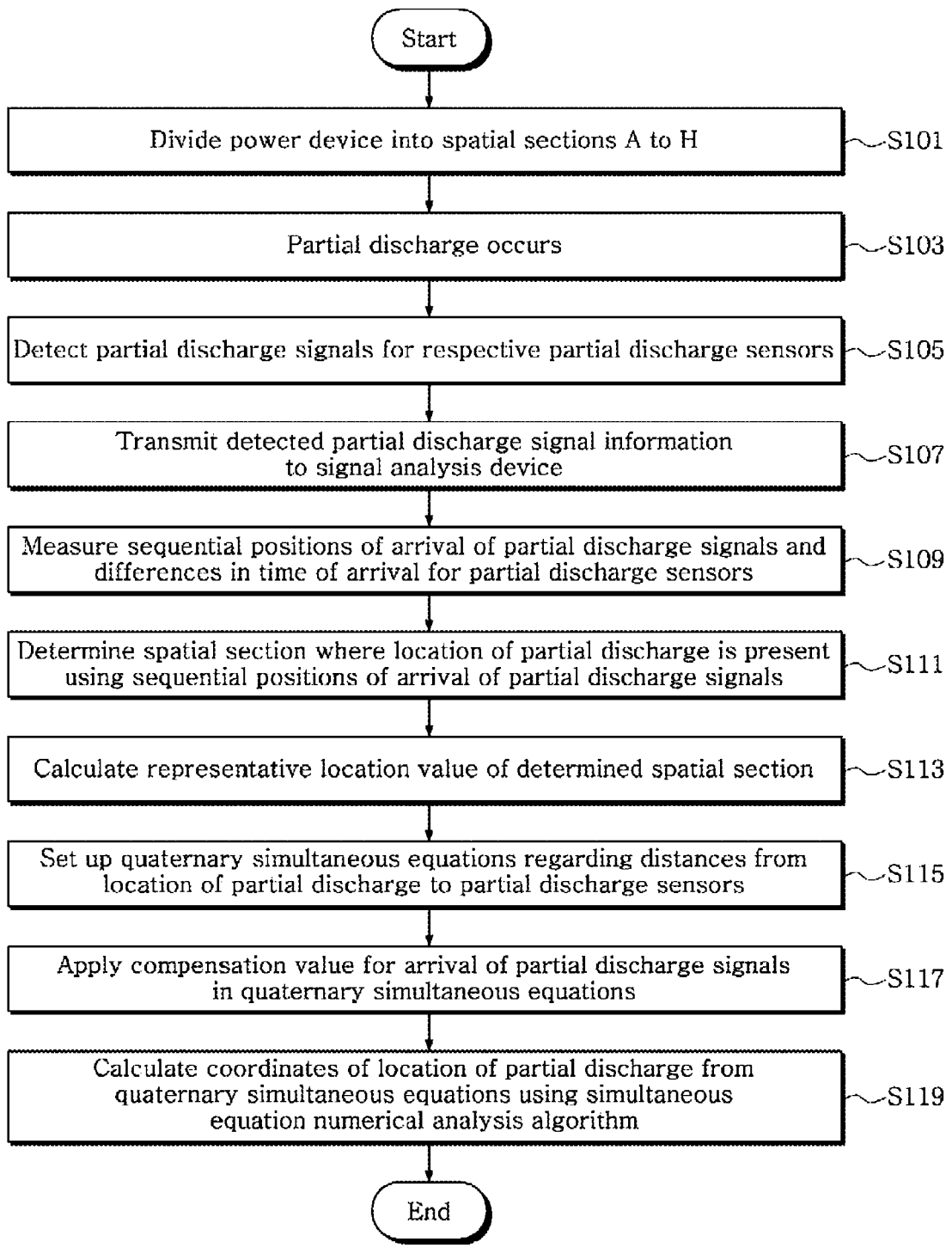
FIG. 2 is a flowchart illustrating a method of detecting the location of a partial discharge in a power device according to an embodiment of the present invention.
Figure 3:
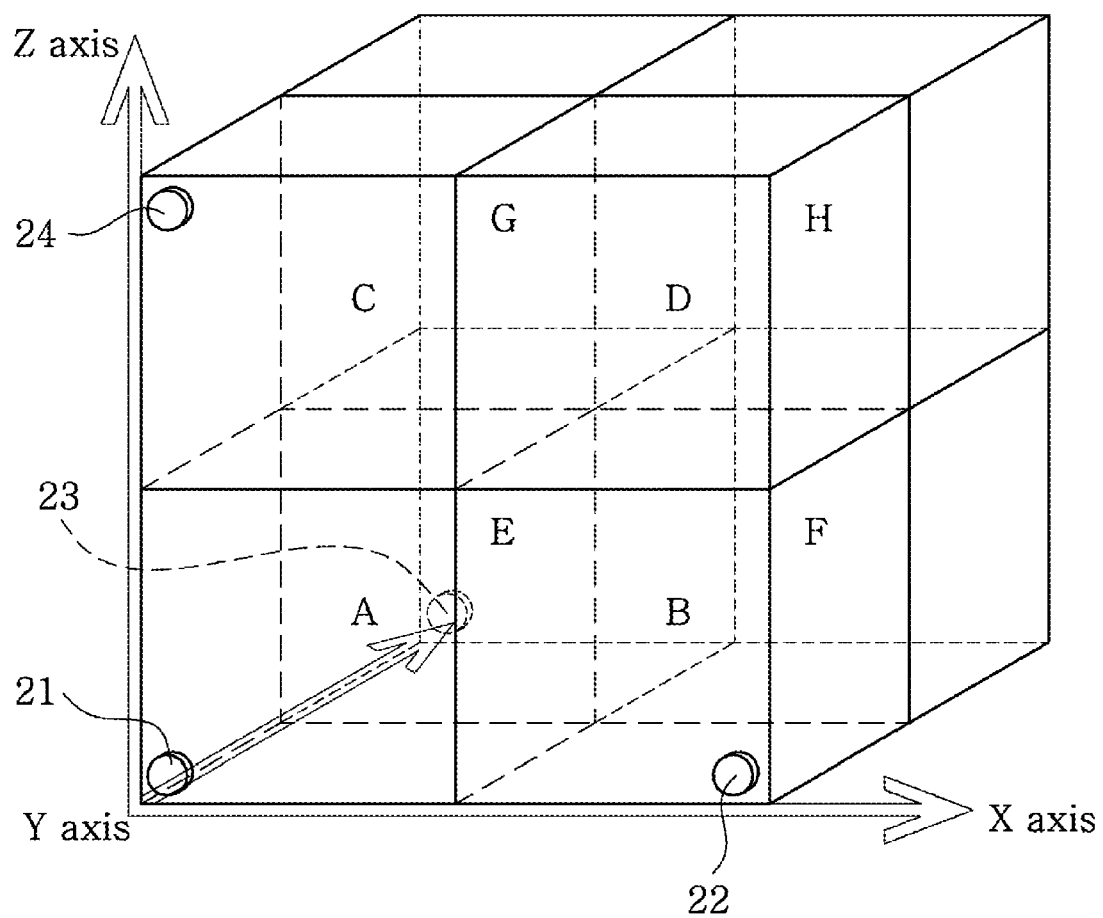
FIG. 3 a diagram illustrating an example in which a power device according to the present invention is divided into a plurality of spatial sections.

FIG. 2 is a flowchart illustrating a method of detecting the location of a partial discharge in a power device according to an embodiment of the present invention. Referring to FIG. 2, in an embodiment of the present invention, the signal analysis device 30 divides the power device 10 into a plurality of spatial sections at step S101. For example, an example in which the power device 10 has been divided into eight spatial sections A to H is illustrated in FIG. 3. Although the example in which the power device 10 has been divided into eight spatial sections A to H is illustrated as a preferred embodiment in the drawing, the present invention is not limited thereto, and the power device 10 may be divided into, for example, 4 to 16 spatial sections. It is preferred that the spatial sections A to H obtained as described above have the same volume.

Thereafter, in FIG. 2, when a partial discharge occurs at a specific location of the power device 10 at step S103 and partial discharge signals reach the plurality of partial discharge sensors 20, the partial discharge sensors 20 detects the respective partial discharge signals at step S105. Thereafter, the individual partial discharge sensors 20 transmit partial discharge signal detection information, including the arrival times of the partial discharge signals, to the signal analysis device 30 at step S107.

Next, the signal analysis device 30 measures the sequential positions of arrival of partial discharge signals and the differences in the time of arrival between the partial discharge signals with respect to the respective partial discharge sensors 20 at step S109. In this case, the sequential positions of arrival of partial discharge signals refers to the sequential positions of arrival of the partial discharge signals for the plurality of partial discharge sensors 20, and the differences in the time of arrival between the partial discharge signals refer to the differences in the time of arrival between the partial discharge signals of the partial discharge sensors 20.

Figure 4:
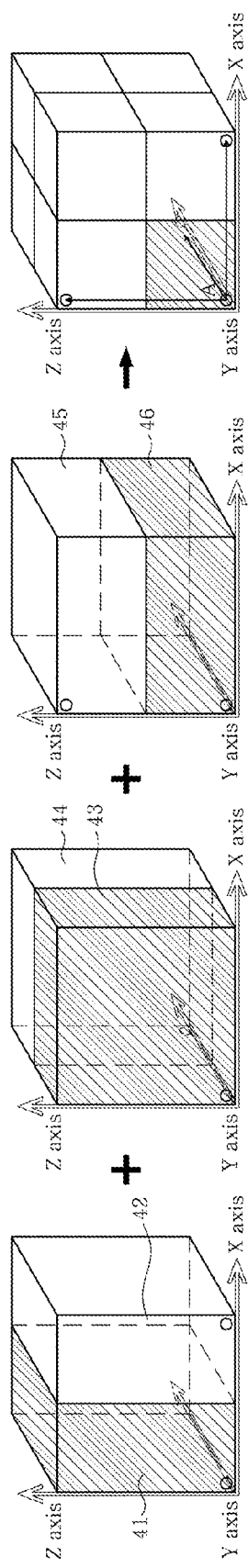
FIG. 4 is a diagram illustrating a process of determining a spatial section where a partial discharge has occurred in a power device according to an embodiment of the present invention.

Thereafter, the signal analysis device 30 determines one of the spatial sections A to H obtained at step S101 to be a spatial section where the location of the partial discharge is present using the measured sequential positions of arrival of the partial discharge signals with respect to the respective partial discharge sensors 20 at step S111, and calculates the representative location value of the determined spatial section at step S113. In the present embodiment, the representative location value of a spatial section refers to the coordinates of a point present in the corresponding spatial section. In FIG. 4, an example of determining a spatial section where the location of the partial discharge is present in the power device 10 is illustrated.

As in an example of FIG. 4, first, one of the left and right spatial sections 41 and 42 of the corresponding power device 10 is determined by comparing the sequential positions of arrival of partial discharge signals with respect to the partial discharge sensor 21 of the origin O and the partial discharge sensor 22 of the X axis. Furthermore, in the same manner, one of the front and back spatial sections 43 and 44 of the corresponding power device 10 is determined by comparing the sequential positions of arrival of partial discharge signals with respect to the partial discharge sensor 21 of the origin O and the partial discharge sensor 23 of the Y axis. Furthermore, in the same manner, one of the upper and lower spatial sections 45 and 46 of the corresponding power device 10 is determined by comparing the sequential positions of arrival of partial discharge signals with respect to the partial discharge sensor 21 of the origin O and the partial discharge sensor 24 of the Z axis. More specifically, for example, assuming that when the sequential positions of arrival of partial discharge signals are compared with respect to the partial discharge sensor 21 of the origin O and the partial discharge sensor 22 of the X axis, the partial discharge signal with respect to the partial discharge sensor 21 of the origin has arrived earlier than the partial discharge signal with respect to the partial discharge sensor 22 of the X axis, it may be determined that the location of a partial discharge is closer to the partial discharge sensor 21 of the origin than the partial discharge sensor 22 of the X axis. The reason for this is that it may be determined that the location of the partial discharge is closer to the left one of the left and right spatial sections 41 and 42 because the partial discharge sensor 21 of the origin and the partial discharge sensor 22 of the X axis are attached to the same surface, as illustrated in FIG. 4. This determination process may be applied to the partial discharge sensors 23 and 24 of the Y and Z axes in the same manner. A spatial section determined as described above and shared by the left and right spatial sections 41 and 42, the front and back spatial sections 43 and 44 and the upper and lower spatial sections 45 and 46 is determined to be a spatial section where the location of the partial discharge is present.

In this case, step S111 of determining the spatial section where the location of a partial discharge is present is intended to primarily select one of a plurality of spatial sections A to H where a location at which a partial discharge has occurred is present based on the sequential positions of arrival of partial discharge signals with respect to the respective partial discharge sensors 20. In particular, the above step is intended to set an initial value to a more reliable value, i.e., a value closer to a solution by setting the representative location value of a selected spatial section as the initial value when obtaining a solution to quaternary simultaneous equations using a simultaneous equation numerical analysis algorithm, which will be described later. The simultaneous equation numerical analysis algorithm has the speed of converging to a solution varying depending on a set initial value, and converges or diverges depending on the set initial value. Accordingly, primarily selecting a spatial section where the location of the partial discharge is present, as in the present embodiment, is intended to enable convergence to a solution in the simultaneous equation numerical analysis algorithm.

Thereafter, quaternary simultaneous equations related to the distances from the location of the partial discharge to the respective partial discharge sensors 20 are set using the differences in the time of arrival between the partial discharge signals with respect to the respective partial discharge sensors 20 at step S115. In this case, quaternary simultaneous equations regarding the respective distances between the location of the partial discharge and the partial discharge sensors are set up using the coordinates (x,y,z) of the location P of the partial discharge and the partial discharge signal arrival time $T_1$ for a first partial discharge sensor (one of the sensors 21 to 24) at which the partial discharge signal has arrived earliest as unknowns. These quaternary simultaneous equations are expressed by Equation 1 below:

$$(x-x_0)^2+(y-y_0)^2+(z-z_0)^2=(c\times T_1)^2$$

$$(x-x_1)^2+(y-y_1)^2+(z-z_1)^2=(c\times (T_1+\Delta t_1))^2$$

$$(x-x_2)^2+(y-y_2)^2+(z-z_2)^2=(c\times (T_1+\Delta t_2))^2$$

$$(x-x_3)^2+(y-y_3)^2+(z-z_3)^2=(c\times (T_1+\Delta t_3))^2 \qquad (1)$$

In this equation, (x,y,z) is the coordinates of the location of the partial discharge to be detected, $(x_0,y_0,z_0)$, $(x_1,y_1,z_1)$, $(x_2,y_2,z_2)$ and $(x_3,y_3,z_3)$ are the coordinates of a plurality of partial discharge sensor installed on the outside surface of the power device, $T_1$ is the partial discharge signal arrival time for the first partial discharge sensor at which the partial discharge signal has arrived earliest, $\Delta t_1$, $\Delta t_2$ and $\Delta t_3$ are the arrival time differences between the arrival time for the first partial discharge sensor and the arrival times for the other partial discharge sensors, and c is partial discharge signal propagation speed in the corresponding power device.

In this case, the coordinates $(x_0,y_0,z_0)$, $(x_1,y_1,z_1)$, $(x_2,y_2,z_2)$ and $(x_3,y_3,z_3)$, the values of $\Delta t_1$, $\Delta t_2$ and $\Delta t_3$, and the propagation speed c are known values, whereas (x,y,z) and $T_1$ are unknowns. The quaternary simultaneous equations regarding the respective distances from the coordinates of the location of the partial discharge to the partial discharge sensors 20 are set up using these four unknowns. In this case, as is well known, the distances may be obtained using the arrival times of the partial discharge signals and the propagation speed.

Figure 5:
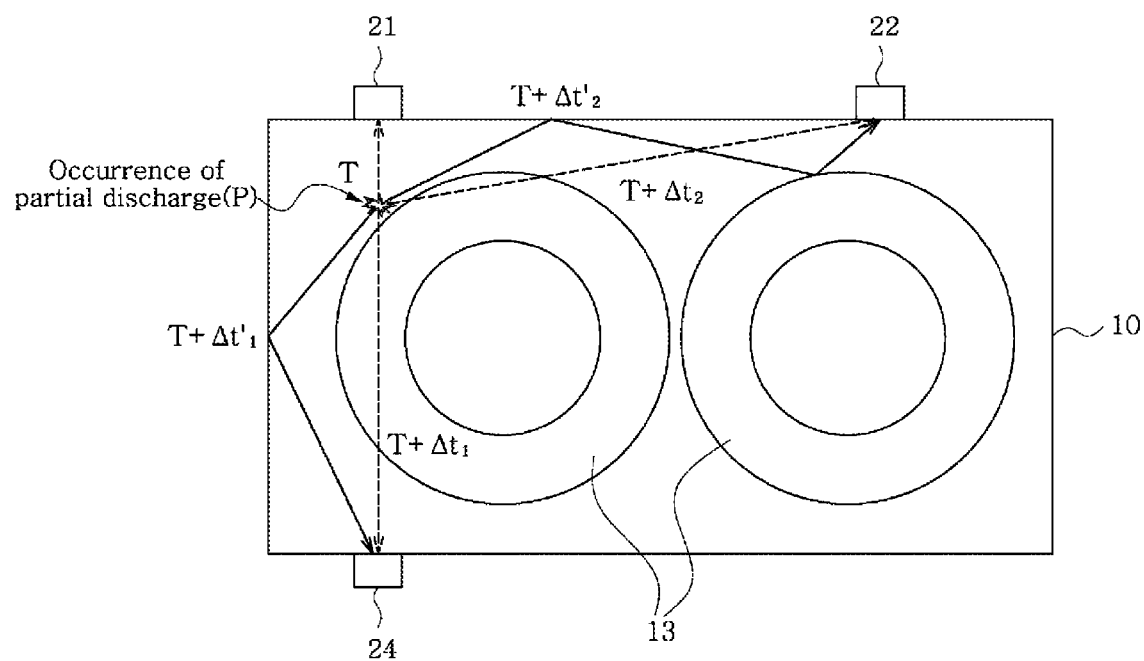
FIG. 5 is a diagram illustrating a compensation value for the differences in the time of arrival between partial discharge signals for each spatial section where a partial discharge has occurred according to an embodiment of the present invention.

Referring back to FIG. 2, in the present embodiment, a compensation value is applied to the differences in the time of arrival between the partial discharge signals in the quaternary simultaneous equations at step S117. That is, the differences in the time of arrival between the partial discharge signals applied to the above-described quaternary simultaneous equations are applied to the case where partial discharge signals are transferred along rectilinear paths in the condition in which there is no structure inside the power device 10. However, in practice, there are various structures (e.g., an internal part, insulating oil, etc.) inside the power device 10, and thus partial discharge signals are not transferred to the partial discharge sensor 20 along ideal rectilinear paths, with the result that there are errors between the theoretical differences in partial discharge signal arrival time and the actual differences in partial discharge signal arrival time. An example of the actual power device 10 is illustrated in FIG. 5. FIG. 5 is a diagram illustrating a compensation value for the differences in the time of arrival between partial discharge signals inside the power device according to an embodiment of the present invention. There are structures 13 and insulating oil (not illustrated) inside the actual power device 10. In this case, when a partial discharge occurs, partial discharge signals do not propagate along ideal rectilinear paths, as described above, but are reflected from the various structures or refracted. Accordingly, the propagation speeds of the partial discharge signals, i.e., the arrival times of the partial discharge signals with respect to the partial discharge sensors 21 to 24, are delayed with respect to theoretical ones ($\Delta t_1'>\Delta t_1$, $\Delta t_2'>t_2$). As a result, there are errors in the actual differences in partial discharge signal arrival time between the partial discharge sensors and the theoretical differences ($T+\Delta t_1'>T+\Delta t_1$). In the present embodiment, gain scheduling is performed in order to compensate for such errors. This is intended to perform compensation by applying a compensation value G to the difference $\Delta t_1'$ in the actual partial discharge signal arrival time in the actual power device 10 so that the difference $\Delta t_1'$ approximates the difference $\Delta t_1$ in theoretical partial discharge signal arrival time appearing in the quaternary simultaneous equations. This relationship may be expressed by Equation 2 below:

$$\Delta t_i = G_{ij} \times \Delta t_i' \quad (i=1,2,3, j=A\sim H) \qquad (2)$$

In this equation, $\Delta t_i$ is the difference in theoretical partial discharge signal arrival time in the state in which there is no internal structure in a power device, i.e., when the partial discharge signals propagate rectilinearly, and $\Delta t_1'$ is the difference in actual partial discharge signal arrival time when the partial discharge signals propagate inside an actual power device in which various internal structures are present. In this case, $\Delta t_1$, $\Delta t_2$ and $\Delta t_3$ refer to the respective differences in theoretical arrival time between the first partial discharge sensor at which the partial discharge signal has arrived earliest and the other second, third and fourth partial discharge sensors, and $\Delta t_1'$, $\Delta t_2'$ and $\Delta t_3'$ refer to the respective differences in actual arrival time between the first partial discharge sensor and the other second, third and fourth partial discharge sensors.

Furthermore, $G_{ij}$ is a compensation value based on each difference in partial discharge signal arrival time and each spatial section in the power device 10, i is the sequential position of the corresponding one of the differences in arrival time between the first partial discharge sensor and the other second, third and fourth partial discharge sensors (respective compensation values are applied to the differences $\Delta t_1'$, $\Delta t_2'$ and $\Delta t_3'$ in arrival time), and j is the location of the spatial section.

It is preferred that the above-described compensation values for the differences in partial discharge signal arrival are set for the respective spatial sections of the power device 10 in advance. Accordingly, when the spatial section where the location of the partial discharge is present is determined as described above, the signal analysis device 30 extracts a compensation value for the differences in the time of arrival between the partial discharge signals corresponding to the determined spatial section, and obtains a solution using the differences in the time of arrival between the partial discharge signals, to which the compensation value has been applied, in the quaternary simultaneous equations. This prevents an error from occurring in the detection of the location of the partial discharge, thereby enabling more reliable detection result to be achieved.

In this case, compensation values for the differences in the time of arrival between the partial discharge signals for the respective partial discharge sensors with respect to the preset spatial sections of the power device 10 may be listed, for example, as shown in the following table. It will be apparent that the table may vary depending on the structure and feature of the power device 10 in various manners:

TABLE 1

| i | A | B | C | D | E | F | G | H |
|---|---|---|---|---|---|---|---|---|
| 1 | $G_{1A}$ | $G_{1B}$ | $G_{1C}$ | $G_{1D}$ | $G_{1E}$ | $G_{1F}$ | $G_{1G}$ | $G_{1H}$ |
| 2 | $G_{2A}$ | $G_{2B}$ | $G_{2C}$ | $G_{2D}$ | $G_{2E}$ | $G_{2F}$ | $G_{2G}$ | $G_{2H}$ |
| 3 | $G_{3A}$ | $G_{3B}$ | $G_{3C}$ | $G_{3D}$ | $G_{3E}$ | $G_{3F}$ | $G_{3G}$ | $G_{3H}$ |

In the present embodiment, the compensation values for the differences in the time of arrival between the partial discharge signals, which are each preset based on the sequential position i of a corresponding difference in the time of arrival and a corresponding spatial section j in the power device 10, as shown in the above table, are used, and thus the reliability of the detection of the location of a partial discharge in the power device 10 can be improved. Accordingly, in the present embodiment, the actual differences in the time of arrival between the partial discharge signals, to which the compensation values have been applied, are applied to the differences in the time of arrival between the partial discharge signals in the quaternary simultaneous equations.

Referring back to FIG. 2, thereafter, the coordinates (x,y,z) of the location P of the partial discharge are calculated from the quaternary simultaneous equations using a simultaneous equation numerical analysis algorithm, in which case the coordinates (x,y,z) of the location P of the partial discharge are calculated by applying the representative location value of the spatial section, determined at step S113, as the initial value of the simultaneous equation numerical analysis algorithm at step S119.

In this case, as described above, in the present invention, when a spatial section where the location of the partial discharge is present is determined, a well-known simultaneous equation numerical analysis algorithm is used to detect the location of the partial discharge. Many algorithms have been proposed for the well-known simultaneous equation numerical analysis algorithm applicable to the present embodiment. For example, the Newton Method or the Newton-Raphson Method algorithm may be used. In general, simultaneous equations numerical analysis is the most efficient method to find the actual value or approximate value of function, has the possibility of not converging to a solution or converging to an erroneous solution, and is difficult to apply in the case where it is difficult to obtain the derivative of a function.

This simultaneous equation numerical analysis algorithm makes use of the fact that if the initial value of a solution is close to a root, a point of intersection between the tangent line thereof and y=0 is considerably closer to the root than current x(i). This process is repeated. As a result, an actual value or an approximate value thereof is obtained. In this case, the approximate value may be set to a value within a preset range around the actual value.

Although the above-described present invention has been described in detail with reference to the preferred embodiments, it should be noted that the present invention is not limited to the content of these embodiments. It will be apparent to those having ordinary knowledge in a technology field to which the present invention pertains that various changes and modifications that are not presented in the embodiments and fall within the attached claims can be made to the present invention and fall within the technical range of the present invention. As a result, the true technical protection range of the present invention should be determined based on the technical spirit of the attached claims.

INDUSTRIAL APPLICABILITY

There are cases where partial discharges occur in various power devices used in power facilities. Since a partial discharge is a potential cause of the failure of a power device, it is important to precisely detect the location of the partial discharge and then eliminate the cause of the partial discharge in advance. For this purpose, there is a need for technology for accurately measuring the location of a partial discharge in a power device.

From this point of view, the present invention can accurately measure the location of a partial discharge in a power device, such as a transformer, and thus can be very usefully employed in the field of power facilities as well as the field of power devices.

The invention claimed is:

1. A method of detecting a location of a partial discharge in a power device using partial discharge signals that arrive at a plurality of partial discharge sensors installed on an outside surface of a power device, the method comprising:
   dividing the power device into a plurality of spatial sections having an identical volume;
   measuring sequential positions of arrival of the partial discharge signals and differences in a time of arrival between the partial discharge signals with respect to the partial discharge sensors;
   determining one of the spatial sections to be a spatial section where the location of the partial discharge is present using the measured sequential positions of arrival of the partial discharge signals, and calculating a representative location value of the determined spatial section;
   setting up quaternary simultaneous equations regarding distances from the location of the partial discharge to the respective partial discharge sensors using the differences in the time of arrival between the partial discharge signals with respect to the respective partial discharge sensors, with coordinates (x,y,z) of the location of the partial discharge and a partial discharge signal arrival time ($T_1$) for a first partial discharge sensor at which the partial discharge signal has arrived earliest being set as unknowns; and
   calculating the coordinates (x,y,z) of the location of the partial discharge from the quaternary simultaneous equations using a simultaneous equation numerical analysis algorithm, wherein the coordinates of the location of the partial discharge are calculated by applying the representative location value of the determined spatial section as an initial value of the simultaneous equation numerical analysis algorithm.

2. The method of claim 1, wherein the plurality of partial discharge sensors are installed at an origin set at a specific point on the outside surface of the power device and locations selected to correspond to three-dimensional rectangular coordinate axes X, Y and Z based on the origin.

3. The method of claim 2, wherein the spatial sections of the power device are 4 to 16 in number.

4. The method of claim 3, wherein determining the spatial section comprises:
   determining one of left and right spatial sections of the power device by comparing the sequential positions of arrival of the partial discharge signals with respect to the partial discharge sensors at the origin and along the X axis, determining one of front and back spatial sections of the power device by comparing the sequential positions of arrival of the partial discharge signals with respect to the partial discharge sensors at the origin and along the Y axis, and determining one of upper and lower spatial sections of the power device by comparing the sequential positions of arrival of the partial discharge signals with respect to the partial discharge sensors at the origin and along the Z axis; and determining the spatial section where the location of the partial discharge is present using the determined left or right, front or back, and upper or lower spatial sections.

5. The method of claim 1, wherein measuring the differences in the time of arrival between the partial discharge signals with respect to the partial discharge sensors comprises:

measuring differences ($\Delta t_1$, $\Delta t_2$ and $\Delta t_3$) between a partial discharge signal arrival time ($T_1$) for the first partial discharge sensor at which the partial discharge signal has arrived earliest and partial discharge signal arrival times ($T_2$, $T_2$ and $T_3$) for the other partial discharge sensors.

6. The method of claim 1, wherein the partial discharge signal arrival time ($T_1$) for the first partial discharge sensor is a time taken from a time point at which the partial discharge occurred to a time point at which the partial discharge signal has arrived at the first partial discharge sensor.

7. The method of claim 1, further comprising, after setting up the quaternary simultaneous equations:

extracting a compensation value for the differences in the time of arrival between the partial discharge signals corresponding to the determined spatial section from compensation values for the differences in the time of arrival between the partial discharge signals for the respective partial discharge sensors preset with respect to the respective spatial sections of the power device; and applying the extracted compensation value for the differences in the time of arrival between the partial discharge signals to the differences in the time of arrival between the partial discharge signals for the respective partial discharge sensors in the set-up quaternary simultaneous equations;

wherein coordinates of the location of the partial discharge are calculated from the quaternary simultaneous equations, to which the arrival time compensation value has been applied, using the simultaneous equation numerical analysis algorithm.

8. The method of claim 7, wherein the preset compensation values for the differences in the time of arrival between the partial discharge signals for the respective partial discharge sensors are set with respect to sequential positions of the differences in the time of arrival between the partial discharge signals for the partial discharge sensors and with respect to the spatial sections.

* * * * *